United States Patent
Hiller et al.

(10) Patent No.: US 9,564,750 B2
(45) Date of Patent: Feb. 7, 2017

(54) DEVICE AND METHOD FOR INCREASING FAULT CLEARING TIME

(71) Applicant: Siemens Aktiengesellschaft, Munich (DE)

(72) Inventors: Martin Hiller, Erfurt (DE); Olaf Michelsson, Arnstadt (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 14/443,387

(22) PCT Filed: Sep. 5, 2013

(86) PCT No.: PCT/EP2013/068385
§ 371 (c)(1),
(2) Date: May 17, 2015

(87) PCT Pub. No.: WO2014/082766
PCT Pub. Date: Jun. 5, 2014

(65) Prior Publication Data
US 2015/0303681 A1 Oct. 22, 2015

(30) Foreign Application Priority Data
Nov. 30, 2012 (DE) .................. 10 2012 221 989

(51) Int. Cl.
| | |
|---|---|
| H02P 9/16 | (2006.01) |
| H02P 9/20 | (2006.01) |
| H02H 7/06 | (2006.01) |
| G01R 31/02 | (2006.01) |
| G01R 31/34 | (2006.01) |

(Continued)

(52) U.S. Cl.
CPC ............ *H02H 7/067* (2013.01); *G01R 31/025* (2013.01); *G01R 31/34* (2013.01); *H02P 29/0241* (2016.02)

(58) Field of Classification Search
USPC ................................................ 322/83; 290/44
See application file for complete search history.

(56) References Cited

U.S. PATENT DOCUMENTS 3,728,618 A * 4/1973 Nimes ...................... H02H 3/50
324/510
4,047,095 A * 9/1977 Wijnterp ................ H02K 19/28
322/17

(Continued)

FOREIGN PATENT DOCUMENTS

| | | |
|---|---|---|
| CN | 101009475 A | 8/2007 |
| CN | 102611365 A | 7/2012 |

(Continued)

OTHER PUBLICATIONS

JP Office Action, dated Jun. 13, 2016, for JP application No. 2015-544384.

(Continued)

*Primary Examiner* — Pedro J Cuevas
(74) *Attorney, Agent, or Firm* — Beusse Wolter Sanks & Maire

(57) ABSTRACT

A device for increasing fault clearing time is provided having a component part designed to identify a short circuit event and load resistors connectable in the event of a fault such that the turbine power transmitted to the shaft is electrically absorbed by the generator and converted into heat until the grid comes back online.

11 Claims, 1 Drawing Sheet

(51) Int. Cl.
*F03D 9/00* (2016.01)
*H02P 9/04* (2006.01)

(56) References Cited

U.S. PATENT DOCUMENTS

| | | | | |
|---|---|---|---|---|
| 4,511,807 A * | 4/1985 | Somerville | ............ | F03D 9/003 290/42 |
| 5,783,891 A * | 7/1998 | Auinger | .................... | H02P 9/38 310/179 |
| 6,856,041 B2 * | 2/2005 | Siebenthaler | ......... | F03D 7/0224 290/44 |
| 7,102,247 B2 * | 9/2006 | Feddersen | ............... | F03D 9/003 290/44 |
| 7,276,807 B2 * | 10/2007 | Luetze | .................. | H02H 7/067 290/44 |
| 8,773,349 B2 * | 7/2014 | Yoon | ........................ | G09G 5/10 345/102 |
| 8,957,536 B2 * | 2/2015 | Gupta | .................. | F03D 7/0284 290/44 |
| 2004/0119292 A1 * | 6/2004 | Datta | .................... | F03D 7/0272 290/44 |
| 2004/0222642 A1 * | 11/2004 | Siebenthaler | ......... | F03D 7/0224 290/44 |
| 2005/0116476 A1 * | 6/2005 | Feddersen | ............... | F03D 9/003 290/44 |
| 2007/0296275 A1 | 12/2007 | Joho | | |
| 2009/0072772 A1 | 3/2009 | Fuchs | | |
| 2010/0096853 A1 | 4/2010 | Richter | | |
| 2011/0298430 A1 * | 12/2011 | Platero Gaona | .......... | H02P 9/10 322/59 |
| 2012/0104754 A1 * | 5/2012 | Rudolf | .................. | F03D 7/0284 290/44 |
| 2012/0181993 A1 | 7/2012 | Hoegh | | |
| 2012/0182328 A1 * | 7/2012 | Yoon | ........................ | G09G 5/10 345/690 |
| 2013/0214537 A1 * | 8/2013 | Hashimoto | ............. | F03D 15/00 290/55 |
| 2014/0240872 A1 * | 8/2014 | Nomura | ................ | H02M 3/156 361/18 |
| 2016/0204601 A1 * | 7/2016 | Donescu | ................ | F03D 7/0272 361/21 |
| 2016/0241153 A1 * | 8/2016 | Abeyasekera | ........ | H02M 7/493 |

FOREIGN PATENT DOCUMENTS

| | | |
|---|---|---|
| CN | 102728829 A | 10/2012 |
| CN | 202503279 U | 10/2012 |
| DE | 102006010537 A1 | 9/2007 |
| EP | 1919055 A2 | 5/2008 |
| EP | 1919055 A3 | 2/2010 |
| EP | 1805887 B1 | 1/2011 |
| JP | 558136299 A | 8/1983 |
| JP | 2000179446 A | 6/2000 |
| JP | 2003056450 A | 2/2003 |
| JP | 2003189697 A | 7/2003 |
| JP | 2010187482 A | 8/2010 |

OTHER PUBLICATIONS

CN Office Action dated Sep. 13, 2016, for CN application No. 201380062802.9.

* cited by examiner

DEVICE AND METHOD FOR INCREASING FAULT CLEARING TIME

CROSS REFERENCE TO RELATED APPLICATIONS

This application is the US National Stage of International Application No. PCT/EP2013/068385 filed Sep. 5, 2013, and claims the benefit thereof. The International Application claims the benefit of German Application No. DE 102012221989.7 filed Nov. 30, 2012. All of the applications are incorporated by reference herein in their entirety.

FIELD OF INVENTION

The invention relates to an apparatus for extending the fault clearing time and to a method for extending the fault clearing time.

BACKGROUND OF INVENTION

Owing to a significant growth in regenerative energy generating units in the supply grids, there are consistently increasing minimum requirements that the grid operators set for all feed-in units as regards stability and supply safety. In this regard, there are grid codes which demand a uniform course of action. Thus, for example, in the Finnish grid code "Fin-Grid", fault clearing times of 250 ms at 0 p.u. residual voltages are required, for example, which for some generators, in particular synchronous generators, results in a fall into asynchronicity, without additional measures, and therefore in a certain resynchronization after recovery of the mains voltage. FIG. 1 shows several grid code requirements. The abovementioned "Fin-Grid" is provided with the reference symbol 1. Further grid code requirements are illustrated here by way of example for E. on 2, REE Spain 3 and WECC North America 4.

The course of action for resynchronization after recovery of mains voltage can take a few minutes, during which the power plant power is not available to the grid. This can primarily result in grid instability and in the worst case scenario in a large-area voltage drop in the case of failure of relatively large power plants.

During the short circuit, the mechanical power impressed onto the shaft assembly by the turbine is no longer taken off at the generator, and therefore results in acceleration of the turbo set.

If the rotor angle of the synchronous generator exceeds a critical transient value, said synchronous generator falls into asynchronicity and needs to be resynchronized. It is demanded in the grid codes that a power plant needs to be able to run through a predefined fault clearing time at a certain residual voltage on the transformer high-voltage side without grid isolation. If this required fault clearing time is above the fault clearing time which can be achieved for the turbo set, additional precautions need to be taken.

Several possibilities for taking into consideration this circumstance are known from the prior art. Thus, for example, in EP 1 805 887 B1, an active boost circuit is connected in series with the generator field winding via slip rings on a charged capacitor in the event of a fault, as a result of which the field voltage is raised suddenly. Thus, the generator is in the over excited range in the event of grid recovery, as a result of which the stability of the turbo set/grid system is increased.

A further possibility for extending the critical fault clearing time includes increasing the moment of inertia of the assembly in order to reduce the shaft acceleration in the event of a short circuit.

Furthermore, for some types of turbine there is the possibility of making changes to the steam turbine in order to clear the steam away from the turbine blades even more quickly, which is referred to as fast valving. Thus, a quicker reduction in the turbine power impressed on the shaft assembly is intended to be achieved.

Likewise, it is known to form similar concepts with loading resistors in the case of offshore wind turbines. However, wind farms are connected to an onshore converter plant via high-voltage DC connections, for example, said onshore converter plant diverting the excess energy from the wind farm into loading resistors in the event of a short circuit on the land.

It would be desirable to have a simple possibility for a turbo set for extending the fault clearing times in the event of a short circuit.

SUMMARY OF INVENTION

This is where the invention comes in, an objective of which includes specifying an apparatus and a method for extending the fault clearing time.

This is achieved by an apparatus for extending the fault clearing time having an electrical generator, in particular synchronous generator and electrical loads and a component part designed to identify a short-circuit event, wherein the apparatus is designed in such a way that, in the event of a short circuit, the electrical loads are connected to the electrical generator.

Advantageously, this is achieved according to aspects of the invention without mechanical intervention for making changes to the given shaft assembly or components thereof.

In a first advantageous development, the electrical loads are in the form of resistors. Thus, the concept is followed of arranging resistors which are connected to the electrical generator as electrical loads in the event of a short circuit and thus, as connectable loading resistors, dissipate the turbine power contributing to the shaft acceleration in the event of a fault without disconnecting the generator from the grid. Thus, the critical fault clearing time is considerably extended.

Advantageous developments are specified in the dependent claims. Thus, in an advantageous development, the apparatus is formed with a transformer, which is connected to the electrical generator, wherein the electrical loads are arranged in parallel with the transformer during the short circuit.

In an alternative embodiment, the apparatus is formed with electrical loads, wherein the electrical loads are arranged in series with the short-circuit path at the transformer neutral point on the high-voltage side.

Likewise, considerable load relief of the generator circuit breaker can be realized as a further potential application of the switchable resistors previously mentioned.

For the design of a generator circuit breaker, the requirement often includes disconnecting said generator circuit breaker as soon as possible in the event of a short circuit.

The sudden generator short circuit which comes about comprises an AC and a DC current component, which decay at different speeds to the steady-state short-circuit current corresponding to their time constants. In particular, the DC component of the short-circuit current is responsible for the current profile experiencing a current zero crossing after only a few milliseconds. Once a circuit breaker has opened, the switching arc burns until this first current zero crossing occurs and the arc can be quenched. In this time, considerable contact loading and thermal heat development arise in the switch owing to the extremely hot arc plasma. It is therefore desirable for the DC component of the short-circuit current to decay as quickly as possible.

The time constant (T) is described in principle by virtue of the ratio of the inductance (L) in the short-circuit path to the resistance (R) effective in the short-circuit path. From the formula T=L/R it becomes clear that as the effective resistance increases, the time constant can be reduced. This can be accelerated effectively by the load resistors described here being switched on once the fault has occurred.

The object is likewise achieved by a method for extending the fault clearing time, wherein the electrical generator connected to an electrical consumer grid is interconnected with additional electrical loads in the event of a short circuit.

BRIEF DESCRIPTION OF THE DRAWINGS

The invention will now be explained in more detail with reference to an exemplary embodiment.

FIG. 2 a first embodiment of the apparatus according to the invention;

FIG. 3 a second embodiment of the apparatus according to the invention.

DETAILED DESCRIPTION OF INVENTION

Figure 1:
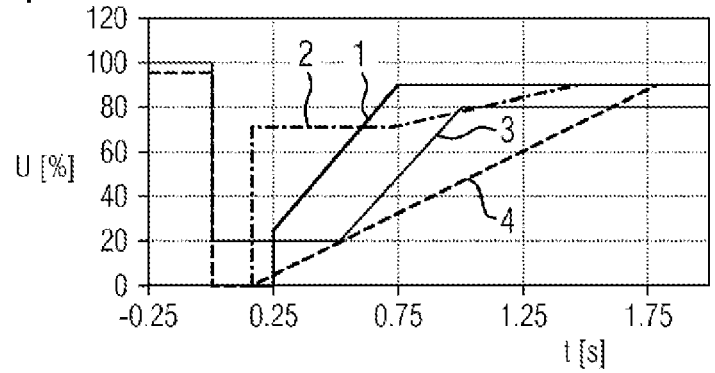
FIG. 1 shows several grid code requirements as detailed in the background.
Figure 2:
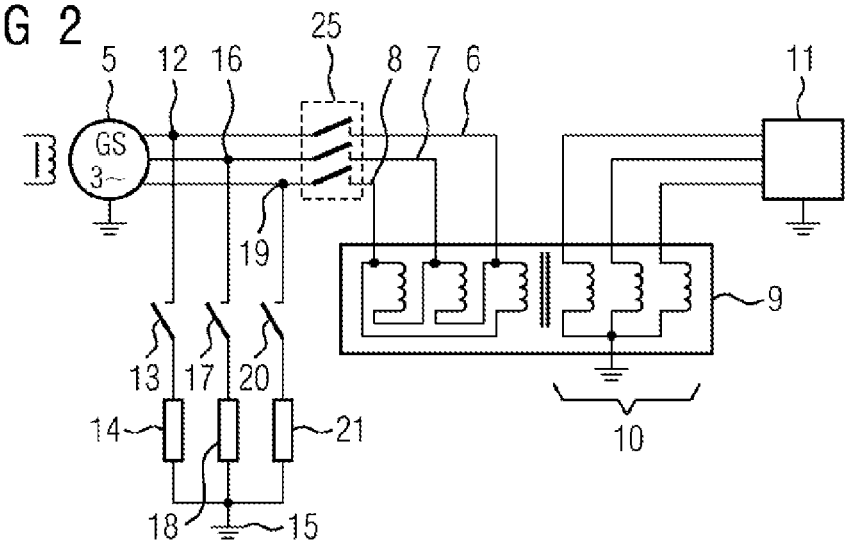
FIGS. 2 and 3 show, schematically.

FIG. 2 shows a three-phase electrical generator 5, in particular synchronous generator, wherein a first phase 6, a second phase 7 and a third phase 8 are formed at the output. The first phase 6, the second phase 7 and the third phase 8 are connected to a transformer 9. The secondary side 10 of the transformer 9 is connected to an electrical grid 11. In the first phase 6, a first outgoing line 12 is provided, by means of which a first switch 13 and electrical loads 14 are connected to ground 15. The second phase 7 comprises a second outgoing line 16 and a second switch 17, which is connected to the second outgoing line 16, and a load 18, which is connected to ground 15. The third phase 8 comprises a third outgoing line 19 and correspondingly a third switch 20 and a load 21, which in turn is connected to ground 15.

The phases 6, 7 and 8 are in this case connected to the transformer 9 via the generator switch 25.

Figure 3:
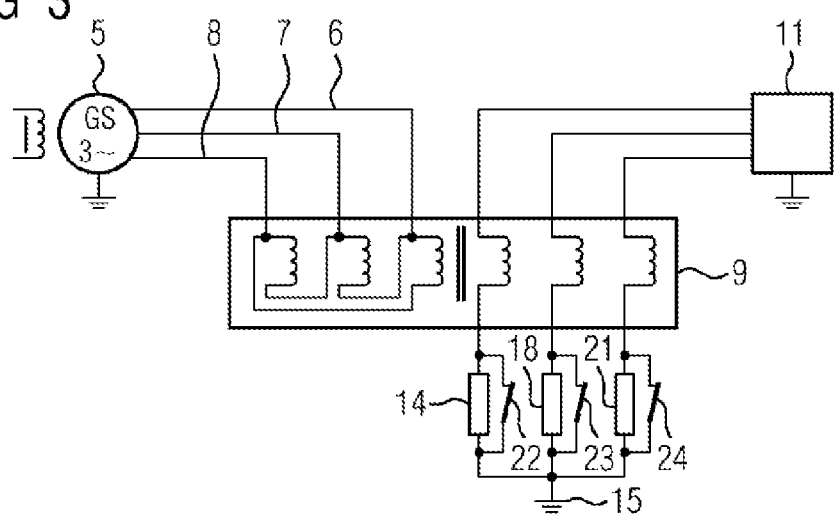

FIG. 3 shows an alternative embodiment of the invention. The difference over FIG. 2 is that the loads 14, 18 and 21 are in series with the short-circuit path at the transformer neutral point on the high-voltage side. In each case one switch 22, 23 and 24 is arranged in parallel with the loads 14, 18 and 21, respectively.

The electrical generator 5 is driven via a turbine (not illustrated). In the event of a fault, the turbine power impressed onto the shaft is connected by the generator 5 via connectable loads 14, 18, 21 until grid recovery and is converted into heat. In other words: in the event of a fault, the turbine power impressed onto the shaft is taken off electrically from the generator 5 and converted into heat via connectable loads 14, 18, 21 until grid recovery. During the fault time, the electrical generator 5 remains connected to the electrical grid 11. Grid resynchronization is therefore not required and a higher degree of power station availability can be achieved. The critical fault clearing time $T_{Ku}$ for the respective assembly without additional loads can generally be determined analytically corresponding to the following formula:

$$T_{Ku} = \sqrt{\frac{2 \cdot \omega_0 \cdot J}{P_r} \cdot (\delta'_{Ku} - \delta'_0)},$$

where
$\omega_0$ denotes the rated circuit frequency
J denotes the moment of inertia of the entire assembly
$\delta'_{Ku}$ denotes the maximum transient voltage angle until stability of the turbo set is obtained
$\delta'_0$ denotes the transient voltage angle prior to the onset of a short circuit
$P_T$ denotes the turbine power.

The loads 14, 18 and 21, which can be in the form of electrical resistors, dissipate the turbine power contributing to the shaft acceleration in the event of a fault, as a result of which the critical fault clearing time is considerably extended and, as a result, there is an increase in the transient stability of the electrical generator 5, in particular synchronous generator, via loading resistors 14, 18 and 21 connectable in the event of a short circuit. The load resistors 14, 18 and 21 illustrated in FIG. 2 are in parallel with the transformer 9 on the transformer low-voltage side in order to make use of the short-circuit residual voltage present in the event of a short circuit over the transformer series impedance. The additional use of adjustable reactances can improve the reactivity of the circuit even more.

FIG. 2 shows the topology for this first embodiment of the invention.

The topology of the second embodiment is shown in FIG. 3. The load resistors 14, 18 and 21 are in series with the short-circuit path at the transformer neutral point on the high-voltage side. They are connected into the short circuit by opening of the parallel switches 22, 23, 24.

Thus, advantageously the critical fault clearing time for electrical generators 5 in the event of a fault is increased, both on the transformer low-voltage side and on the transformer high-voltage side. An expansion of the circuit topology with switchable or adjustable reactances can increase the fault clearing time further still.

In accordance with the invention, therefore, the critical fault clearing time can be considerably extended without needing to make any design changes to the turbine and generator 5, which results in an inexpensive measure of the invention illustrated here. In addition, no grid isolation during the temporally limited short circuit is required, so that permanent availability of the electrical generator 5 without resynchronization can be achieved.

The invention claimed is:
1. An apparatus for extending the fault clearing time comprising:
   an electrical generator;
   electrical loads formed with switches arranged in parallel;
   a transformer, which is connected to the electrical generator; and
   a component part designed to identify a short circuit event,
   wherein the apparatus is designed in such a way that, in the event of a short circuit, the electrical loads are connected to the electrical generator, the electrical loads are arranged in series with the short circuit path at the transformer neutral point on the high voltage side, and the switches are opened.

2. The apparatus as claimed in claim 1,
wherein the electrical loads are in the form of load resistors.

3. The apparatus as claimed in claim 1,
wherein the electrical loads are connected in parallel with the transformer.

4. The apparatus as claimed in claim 1,
wherein the electrical generator has three phases.

5. The apparatus as claimed in claim 1,
wherein electrical generator comprises a synchronous generator.

6. A method for extending the fault clearing time in the case of an electrical generator, which is connected to an electrical consumer grid, the method comprising:
in the event of a short circuit, connecting additional electrical loads to the electrical generator;
wherein the electrical loads are arranged in series with the short circuit path at a transformer neutral point and, in the event of a short circuit, switches arranged in parallel with the electrical loads are opened.

7. The method as claimed in claim 6,
wherein the electrical loads are in the form of load resistors.

8. The method as claimed in claim 6,
wherein the electrical loads are in parallel with a transformer, which is connected to the electrical generator.

9. The apparatus as claimed in claim 4,
wherein electrical generator comprises a synchronous generator.

10. The method as claimed in claim 6,
wherein electrical generator comprises a synchronous generator.

11. The method as claimed in claim 8,
wherein electrical generator comprises a synchronous generator.

\* \* \* \* \*